(12) United States Patent
Yoo et al.

(10) Patent No.: US 10,128,243 B2
(45) Date of Patent: Nov. 13, 2018

(54) SEMICONDUCTOR DEVICE WITH FIN FIELD EFFECT TRANSISTORS HAVING DIFFERENT SEPARATION REGIONS BETWEEN FINS IN NMOS AND PMOS REGIONS

(71) Applicant: SAMSUNG ELECTRONICS CO., LTD., Suwon-si, Gyeonggi-do (KR)

(72) Inventors: Je-Min Yoo, Suwon-si (KR); Sangyoon Kim, Gwangmyeong-si (KR); Woosik Kim, Yongin-si (KR); Jongmil Youn, Yongin-si (KR); Hwasung Rhee, Seongnam-si (KR); Heedon Jeong, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 4 days.

(21) Appl. No.: 14/955,107

(22) Filed: Dec. 1, 2015

(65) Prior Publication Data
US 2016/0155741 A1 Jun. 2, 2016

(30) Foreign Application Priority Data
Dec. 1, 2014 (KR) .......................... 10-2014-0169731

(51) Int. Cl.
*H01L 27/092* (2006.01)
*H01L 27/02* (2006.01)
*H01L 21/8238* (2006.01)

(52) U.S. Cl.
CPC ...... *H01L 27/0924* (2013.01); *H01L 27/0207* (2013.01); *H01L 21/823821* (2013.01); *H01L 21/823878* (2013.01); *H01L 27/0928* (2013.01)

(58) Field of Classification Search
CPC ..... H01L 21/823821; H01L 21/823878; H01L 27/0924; H01L 27/0928; H01L 29/66795; H01L 29/785; H01L 27/0886
See application file for complete search history.

(56) References Cited

U.S. PATENT DOCUMENTS

| 6,656,783 | B2 | 12/2003 | Park |
| 7,034,359 | B2 | 4/2006 | Harada |
| 7,521,333 | B2 | 4/2009 | Choi et al. |
| 7,667,248 | B2 | 2/2010 | Booth, Jr. et al. |

(Continued)

FOREIGN PATENT DOCUMENTS

| JP | 2004-221485 A | 8/2004 |
| JP | 2006-164998 A | 6/2006 |

(Continued)

*Primary Examiner* — Marcos D Pizarro
*Assistant Examiner* — Shannon Yi
(74) *Attorney, Agent, or Firm* — Lee & Morse P.C.

(57) ABSTRACT

A semiconductor device includes a substrate with a NMOS region and a PMOS region, a device isolation layer on the substrate to define active fins, and gate patterns on the substrate to have a length direction crossing the active fins, wherein the device isolation layer includes diffusion brake regions between respective pairs of the active fins, the diffusion brake regions being disposed adjacent to each other in a width direction of the gate patterns, and wherein a width of the diffusion brake region in the NMOS region is different from a width of the diffusion brake region in the PMOS region.

20 Claims, 13 Drawing Sheets

(56) References Cited

U.S. PATENT DOCUMENTS

| | | | |
|---|---|---|---|
| 2013/0228866 A1* | 9/2013 | Lee | H01L 21/823431 257/355 |
| 2015/0054078 A1* | 2/2015 | Xie | H01L 29/785 257/347 |
| 2015/0115363 A1* | 4/2015 | Chang | H01L 21/823431 257/347 |
| 2015/0236131 A1* | 8/2015 | Chang | H01L 29/66795 257/401 |
| 2015/0318354 A1* | 11/2015 | Yin | H01L 29/785 257/288 |
| 2016/0148935 A1* | 5/2016 | Chen | H01L 27/0924 257/369 |
| 2016/0204037 A1* | 7/2016 | Goel | H01L 29/267 438/429 |

FOREIGN PATENT DOCUMENTS

| | | |
|---|---|---|
| JP | 2010-153623 A | 7/2010 |
| KR | 10-2006-0029498 A | 4/2006 |

\* cited by examiner

SEMICONDUCTOR DEVICE WITH FIN FIELD EFFECT TRANSISTORS HAVING DIFFERENT SEPARATION REGIONS BETWEEN FINS IN NMOS AND PMOS REGIONS

CROSS-REFERENCE TO RELATED APPLICATION

Korean Patent Application No. 10-2014-0169731, filed on Dec. 1, 2014, in the Korean Intellectual Property Office, and entitled: "Semiconductor Device with Fin Field Effect Transistors," is incorporated by reference herein in its entirety.

BACKGROUND

1. Field

Example embodiments relate to a semiconductor device, and in particular, to a semiconductor device with fin-FETs.

2. Description of the Related Art

As a consequence of the high integration of semiconductor devices, it is becoming harder to realize improvement in transistor performance required by the customers. To overcome these technical difficulties, there have been suggested a variety of field effect transistor (FET) structures. For example, a high-k metal gate structure has been proposed to replace a conventional FET structure using a silicon oxide layer and a polysilicon layer as a gate insulating layer and a gate electrode.

SUMMARY

Example embodiments provide a semiconductor device including fin-FETs with improved performance.

Other example embodiments provide a semiconductor device including fin-FETs configured to reduce a variation in device characteristics thereof.

According to example embodiments, a semiconductor device may include a substrate with a NMOS region and a PMOS region, a device isolation layer on the substrate to define active fins, and gate patterns on the substrate to have a length direction crossing the active fins, wherein the device isolation layer includes diffusion brake regions between respective pairs of the active fins, the diffusion brake regions being disposed adjacent to each other in a width direction of the gate patterns, and wherein a width of the diffusion brake region in the NMOS region is different from a width of the diffusion brake region in the PMOS region.

In example embodiments, the active fins may have substantially the same width in the length direction of the gate patterns.

In example embodiments, the width of the diffusion brake region may be greater on the NMOS region than on the PMOS region.

In example embodiments, the width of the diffusion brake region may be smaller on the NMOS region than on the PMOS region.

In example embodiments, the gate patterns may include gate electrodes spaced apart from the diffusion brake regions and dummy gate patterns overlapped with the diffusion brake regions, respectively.

In example embodiments, the diffusion brake regions may have a width ranging from about 20 nanometers to about 100 nanometers, and the number of the dummy gate patterns overlapped with each of the diffusion brake regions may be one.

In example embodiments, the diffusion brake regions may have a width ranging from about 50 nanometers to about 500 nanometers, and the number of the dummy gate patterns overlapped with each of the diffusion brake regions may be two.

In example embodiments, the device isolation layer may have a top surface lower than those of the active fins and exposes sidewalls of each of the active fins, and each of the gate electrodes may be provided to cross at least one of the active fins and face sidewalls of the active fins, which are parallel to a length direction of the active fins.

In example embodiments, each of the dummy gate patterns may be disposed in such a way that a distance from one of the diffusion brake regions most adjacent thereto is less than that from one of the gate electrodes most adjacent thereto.

In example embodiments, the device may further include epitaxial patterns provided at both sides of each of the gate patterns. Each of the active fins may further include a channel region positioned below the gate pattern, and the epitaxial patterns may be formed of a material exerting compressive or tensile stress on the channel region.

According to example embodiments, a semiconductor device may include a substrate with an NMOS region and a PMOS region, a device isolation layer provided on the substrate to define active fins, the device isolation layer including first and second separation regions defining sidewalls of the active fins in length and width directions of the active fins, a gate electrode spaced apart from the second separation region to cross the first separation region of the device isolation layer, and a dummy gate pattern including at least a portion overlapped with the second separation region of the device isolation layer. The second separation region positioned between an adjacent pair of the active patterns may be used as a diffusion brake region, and a width of the diffusion brake region may be different between the NMOS and PMOS regions.

In example embodiments, the active fins may have substantially the same width.

In example embodiments, the width of the diffusion brake region may be greater on the NMOS region than on the PMOS region.

In example embodiments, the width of the diffusion brake region may be smaller on the NMOS region than on the PMOS region.

In example embodiments, the number of the dummy gate pattern overlapped with the second separation region may be one or two.

According to example embodiments, a semiconductor device may include a substrate with an NMOS region and a PMOS region, and gate patterns provided on the substrate. The substrate may include active fins formed on regions of the substrate, except for first and second separation regions and a fin-removing region. The first separation regions may be formed to define long sidewalls of the active fins, and the second separation regions may be formed to define short sidewalls of the active fins. Widths of the second separation regions may be the same on each of the NMOS and PMOS regions and may be different between the NMOS and PMOS regions.

In example embodiments, the first separation regions may be spaced apart from each other by substantially the same space, and the active fins may have substantially the same width.

In example embodiments, the width of the second separation region may be greater on the NMOS region than on the PMOS region.

In example embodiments, the width of the second separation region may be smaller on the NMOS region than on the PMOS region.

In example embodiments, the number of the dummy gate pattern overlapped with the second separation region may be one or two.

According to example embodiments, a semiconductor device may include a substrate with a NMOS region and a PMOS region, a device isolation layer on the substrate to define active fins, gate patterns on the substrate crossing the active fins, and separation regions in the device isolation layer, the separation regions being between respective pairs of the active fins, and being adjacent to each other in a length direction of the active fins, wherein width of separation regions in the NMOS region along the length direction of the active fins is different from widths of separation regions in the PMOS region along the length direction of the active fins.

In example embodiments, the width of each separation region in the NMOS region along the length direction of the active fins may be larger than the width of each separation region in the PMOS region along the length direction of the active fins.

In example embodiments, the width of each separation region in the NMOS region along the length direction of the active fins may be smaller than the width of each separation region in the PMOS region along the length direction of the active fins.

In example embodiments, widths of all the separation regions in the NMOS region may be equal to each other, and widths of all the separation regions in the PMOS region may be equal to each other.

In example embodiments, each active fin may extend between two adjacent separation regions, the active fin being spaced apart form the two adjacent separation regions and being perpendicular to the two adjacent separation regions.

In example embodiments, widths of all active fins between same adjacent separation regions may be the same.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
FIGS. 1 through 3 illustrate conceptual diagrams of an arrangement of active fins of a semiconductor device according to example embodiments.

Example embodiments will now be described more fully with reference to the accompanying drawings, in which the example embodiments are shown. Example embodiments may, however, be embodied in many different forms and should not be construed as being limited to those set forth herein; rather, these embodiments are provided so that this disclosure will be thorough and complete, and will fully convey the concept of example embodiments to those of skill in the art. In the drawings, the thicknesses of layers and regions are exaggerated for clarity. Like reference numerals in the drawings denote like elements.

It will be understood that when an element is referred to as being "on," "connected," or "coupled" to another element, it can be directly on, connected, or coupled to the other element or intervening elements may be present. In contrast, when an element is referred to as being "directly on," "directly connected," or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
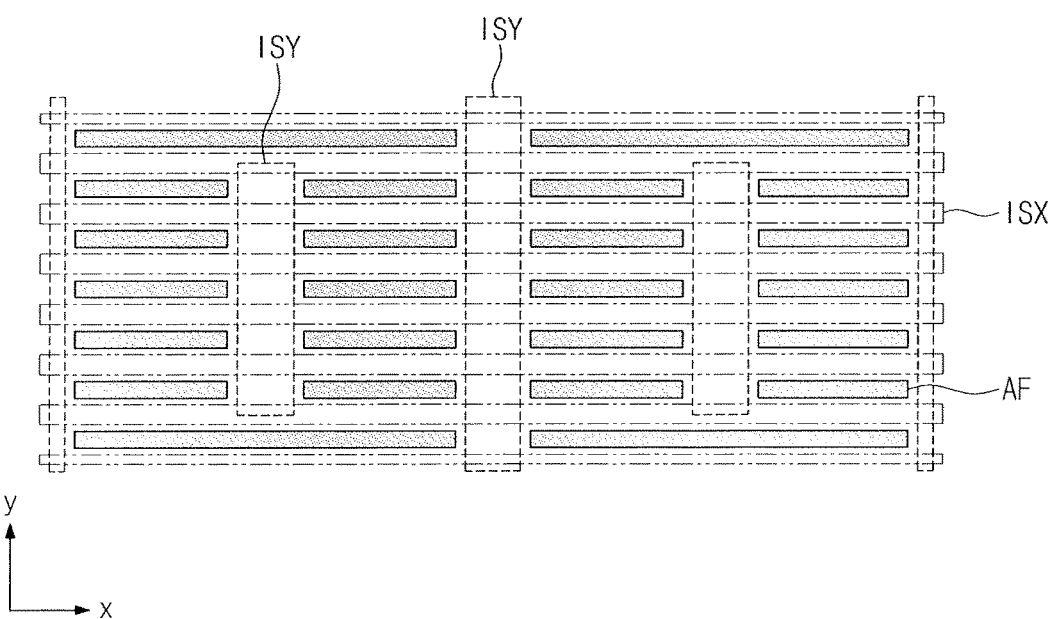
Figure 3:
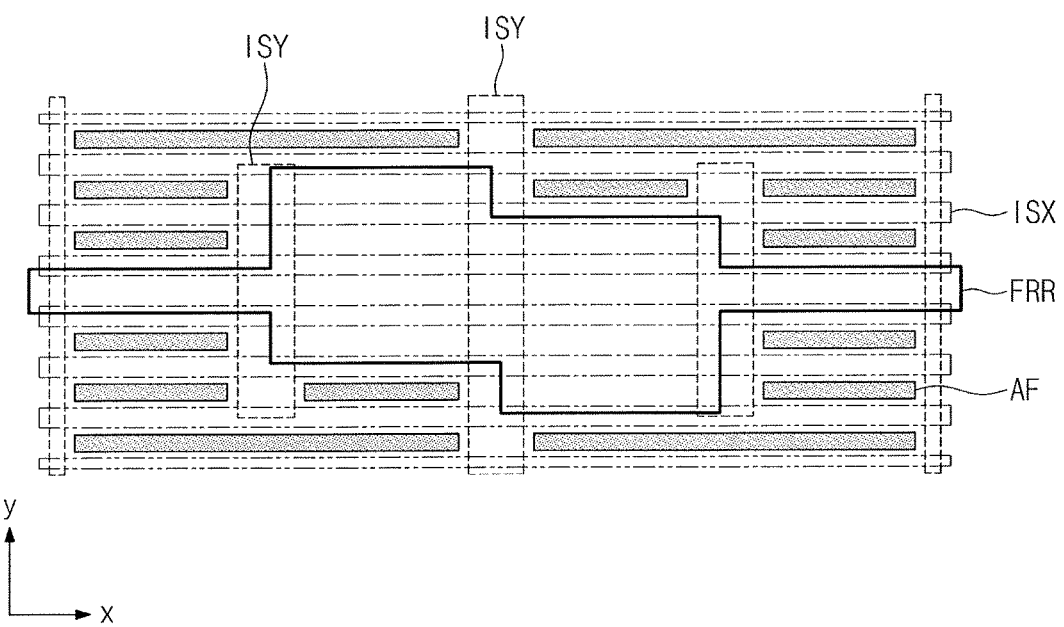

FIGS. 1 through 3 are conceptual diagrams of an arrangement of active fins of a semiconductor device according to example embodiments.

Referring to FIGS. 1 through 3, a semiconductor device according to example embodiments may include active fins AF disposed on regions of a substrate, except for first separation regions ISX, second separation regions ISY (or "diffusion brake regions"), and fin-removing regions FRR. For example, when viewed in a plan view, the active fins AF may be disposed not to be overlapped with the first separation regions ISX, the second separation regions ISY, the fin-removing regions FRR, and intersecting regions thereof.

The active fins AF may be parts of a substrate. Hereinafter, the terms "thickness direction", "length direction", and "width direction" will be used to represent three orthogonal directions of a pattern. Here, the thickness direction represents a direction normal to a top surface of the substrate or top surfaces of the active fins AF, and the length and width directions represent two directions parallel to the top surface of the substrate. The length direction is selected in such a way that the pattern has the longest length in the direction, and the width direction is selected to be perpendicular to the length direction.

The first separation regions ISX may be defined to be parallel to each other. Accordingly, as shown in FIG. 1, when the first separation regions ISX are considered, the active fins AF may have sidewalls parallel to the first separation regions ISX, e.g., the first separation regions ISX and the active fins AF may extend along the x-axis.

The second separation regions ISY may be defined to be parallel to each other but cross the first separation regions ISX. For example, as shown in FIG. 2, the second separation regions ISY may be defined to perpendicularly cross the first separation regions ISX, e.g., the second separation regions ISY may extend along the y-axis.

The first separation regions ISX may be formed spaced apart from each other by substantially the same distance, in the length direction of the second separation regions ISY. Accordingly, widths of the active fins AF may be substantially the same in the length direction of the second separation regions ISY.

The second separation regions ISY may be spaced apart from each other in the length direction of the first separation regions ISX. A space between the second separation regions ISY may be greater than that between the first separation regions ISX. Due to such a difference in spaces between the first and second separation regions ISX and ISY, the length and width directions for the active fins AF can be determined. For example, the active fins AF may have the length direction parallel to the first separation regions ISX and the width direction parallel to the second separation regions ISY.

Further, lengths of the first separation regions ISX may be substantially the same, and lengths of the second separation regions ISY may have various values. For example, as shown in FIG. 2, the lengths of the second separation regions ISY defining short sidewalls of the active fins AF may be different.

Arrangement of the fin-removing regions FRR may be variously changed in consideration of needs of a user. For example, as shown in FIGS. 2 and 3, the fin-removing regions FRR may be used to partially remove the active fins AF defined by the first and second separation regions ISX and ISY. In example embodiments, the fin-removing regions FRR may be used to divide the active fins AF into a NMOS region and a PMOS region, to define regions for transistors, or to define regions for gate/source/drain contact plugs, but example embodiments are not limited thereto.

Meanwhile, the second separation regions ISY and the fin-removing regions FRR may define regions to be additionally removed from the active fins AF of FIG. 1, which is defined by the first separation regions ISX. However, such an additional removal process of the active fins AF may not need to use the second separation regions ISY and the fin-removing regions FRR in an independent manner. For example, in example embodiments, the additional removal process on the active fins AF may include a single patterning process of removing regions defined by the second separation regions ISY and the fin-removing regions FRR at the same time. As an example, regions defined by the second separation regions ISY and the fin-removing regions FRR may be removed by a single process for forming a shallow or deep trench. In other example embodiment, the additional removal process of the active fins AF may include two steps of removing regions defined by the second separation regions ISY and removing regions defined by the fin-removing regions FRR, and the order of the steps may be changed.

Figure 4:
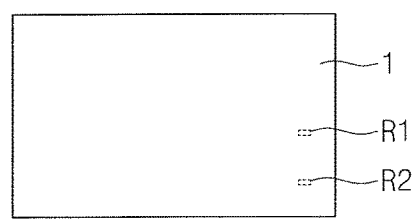
FIG. 4 illustrates a plan view of an example of a semiconductor device according to example embodiments.

FIG. 4 is a plan view illustrating an example of a semiconductor device according to example embodiments.

Referring to FIG. 4, a semiconductor device 1 according to example embodiments may include a first region R1 and a second region R2, on which transistors of different conductivity types will be formed. In example embodiments, NMOS transistors may be formed on the first region R1, and PMOS transistors may be formed on the second region R2. In other example embodiments, the NMOS transistors may be formed on the second region R2, and the PMOS transistors may be formed on the first region R1.

Figure 5:
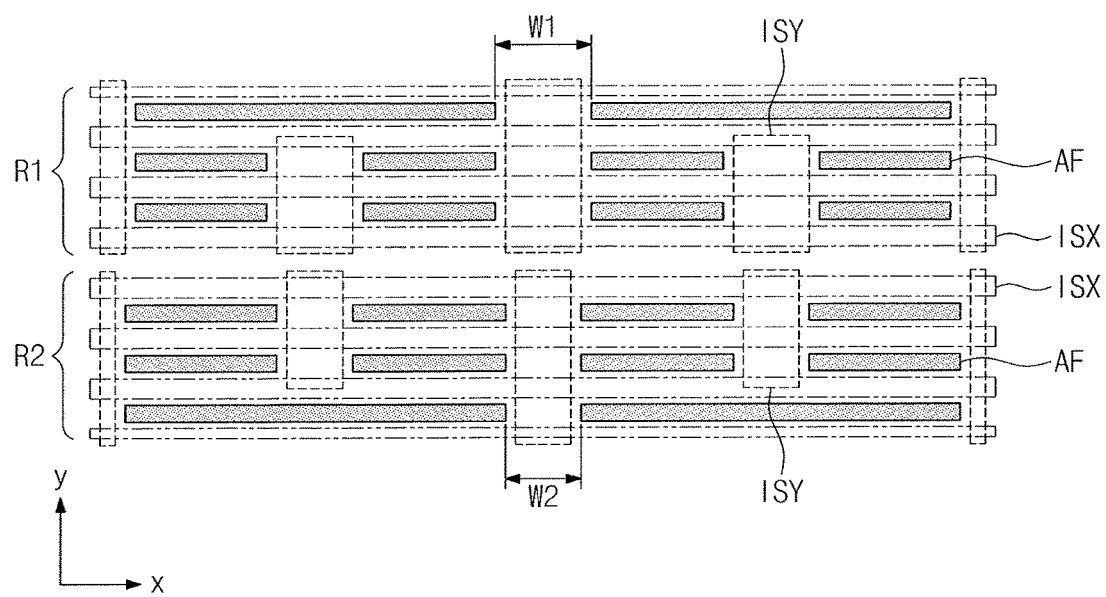
FIG. 5 illustrates a plan view of a portion of a fin-FET semiconductor device including active fins according to example embodiments.

FIG. 5 is a plan view exemplarily illustrating a portion of the fin-FET semiconductor device including active fins according to example embodiments.

Referring to FIG. 5, the active fins AF may be formed on each of the first and second regions R1 and R2 to have long sidewalls, e.g., along the x-axis, defined by the first separation regions ISX and short sidewalls, e.g., along the y-axis, defined by the second separation regions ISY. The widths and spaces of the first separation regions ISX may have no difference between the first and second regions R1 and R2. Accordingly, all of the active fins AF may have substantially the same width, e.g., along the y-axis, and may be spaced apart from each other by substantially the same space, e.g., along the y-axis.

In contrast, widths W1 of the second separation regions ISY, e.g., along the x-axis, in the first region R1 may be greater than widths W2 in the second region R2, i.e., W1>W2. The widths W1 of the second separation regions ISY in the first region R1 may be substantially the same, and the widths W2 of the second separation regions ISY in the second region R2 may be substantially the same.

Although not shown in FIG. 5, the fin-removing regions FRR may be positioned on each of the first and second regions R1 and R2 or between the first and second regions R1 and R2. Further, positions of the second separation regions ISY may be variously changed from that shown in FIG. 5.

Figure 6:
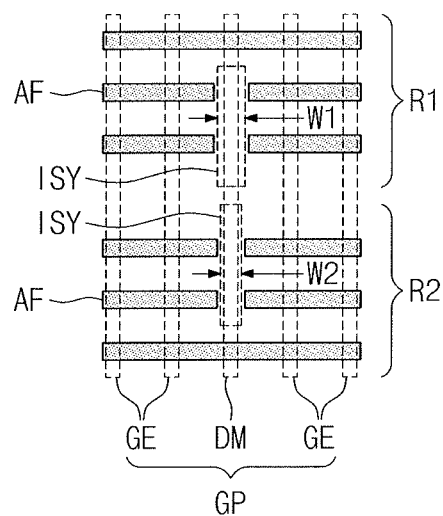
FIG. 6 illustrates a plan view of a fin-FET semiconductor device including active fins according to other example embodiments.
Figure 7:
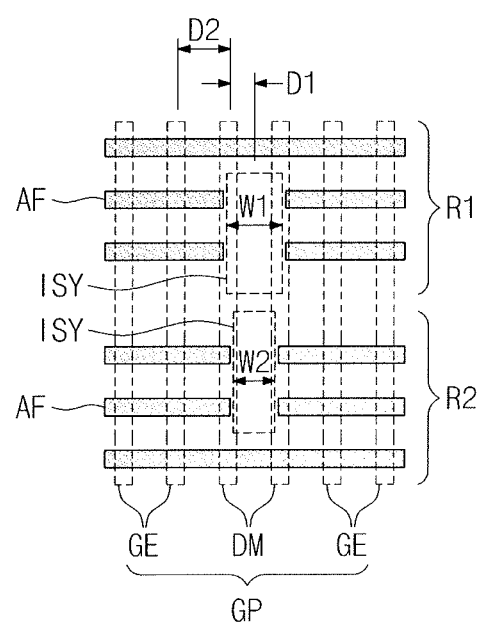
FIG. 7 illustrates a plan view of a fin-FET semiconductor device including active fins according to still other example embodiments.

FIG. 6 is a plan view illustrating a fin-FET semiconductor device including active fins according to other example embodiments, and FIG. 7 is a plan view illustrating a fin-FET semiconductor device including active fins according to still other example embodiments.

Referring to FIGS. 6 and 7, gate patterns GP having a length direction, e.g., along the y-axis, oriented to cross the active fins AF may be provided on the substrate. The gate patterns GP may include gate electrodes GE spaced apart from the second separation regions ISY, e.g., along the x-axis, and dummy gates DM adjacent to the second separation regions ISY, e.g., the dummy gates DM may overlap the second separation regions ISY.

In example embodiments, as shown in FIGS. 6 and 7, each of the dummy gates DM may be overlapped with at least one of the second separation regions ISY. Each of the gate electrodes GE may be spaced apart from the second separation regions ISY, e.g., along the x-axis, to cross at least one of the active fins AF. Further, each of the gate electrodes GE may be disposed to face sidewalls of the active fins AF that are parallel to the length direction of the active fins AF (e.g., FIG. 16). In example embodiments, as shown in FIGS. 6 and 7, at least one of the dummy gates DM may be positioned between the gate electrode GE and the second separation region ISY, but example embodiments are not limited thereto.

At least one of the dummy gates DM may be spaced apart from the second separation regions ISY, e.g., a center line of at least one of the dummy gates DM along the y-axis may be spaced apart along the x-axis from a center line of the second separation regions ISY along the y-axis. In this case, each of such dummy gates DM may be disposed in such a way that a distance D1 from one of the second separation regions ISY most adjacent thereto is less than a distance D2 from one of the gate electrodes GE most adjacent thereto. For example, as illustrated in FIG. 7, the distance D1, e.g., a distance along the x-axis between the center lines of the dummy gate DM and a most adjacent second separation region ISY, may be smaller than the distance D2, e.g., a distance along the x-axis between the center lines of the same second separation region ISY and a most adjacent gate electrodes GE.

For example, as shown in FIG. 6, each of the second separation regions ISY may be overlapped with a corresponding one of the dummy gates DM. In this case, the second separation regions ISY may be formed to have a width ranging from about 20 nanometers to about 100 nanometers.

In another example, as shown in FIG. 7, each of the second separation regions ISY may be overlapped with a corresponding pair of the dummy gates DM. In this case, the second separation regions ISY may be formed to have a width ranging from about 50 nanometers to 500 nanometers.

Figure 8:
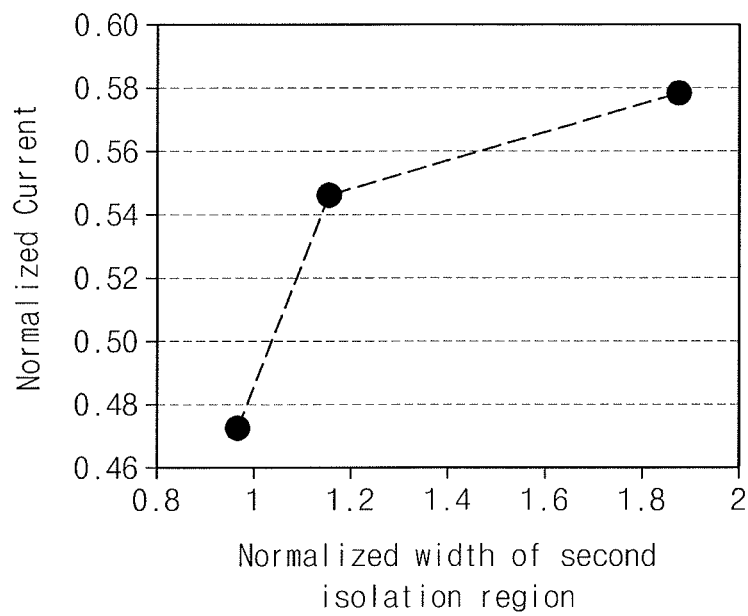
FIG. 8 illustrates a graph showing a relationship between current of an NMOS transistor and a width of the second separation region.
Figure 9:
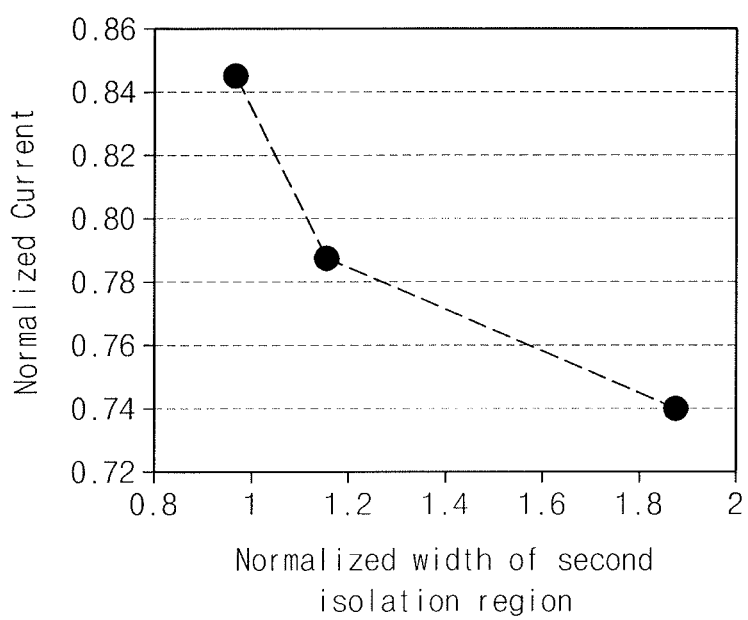
FIG. 9 illustrates a graph showing a relationship between current of a PMOS transistor and a width of the second separation region.
Figure 10:
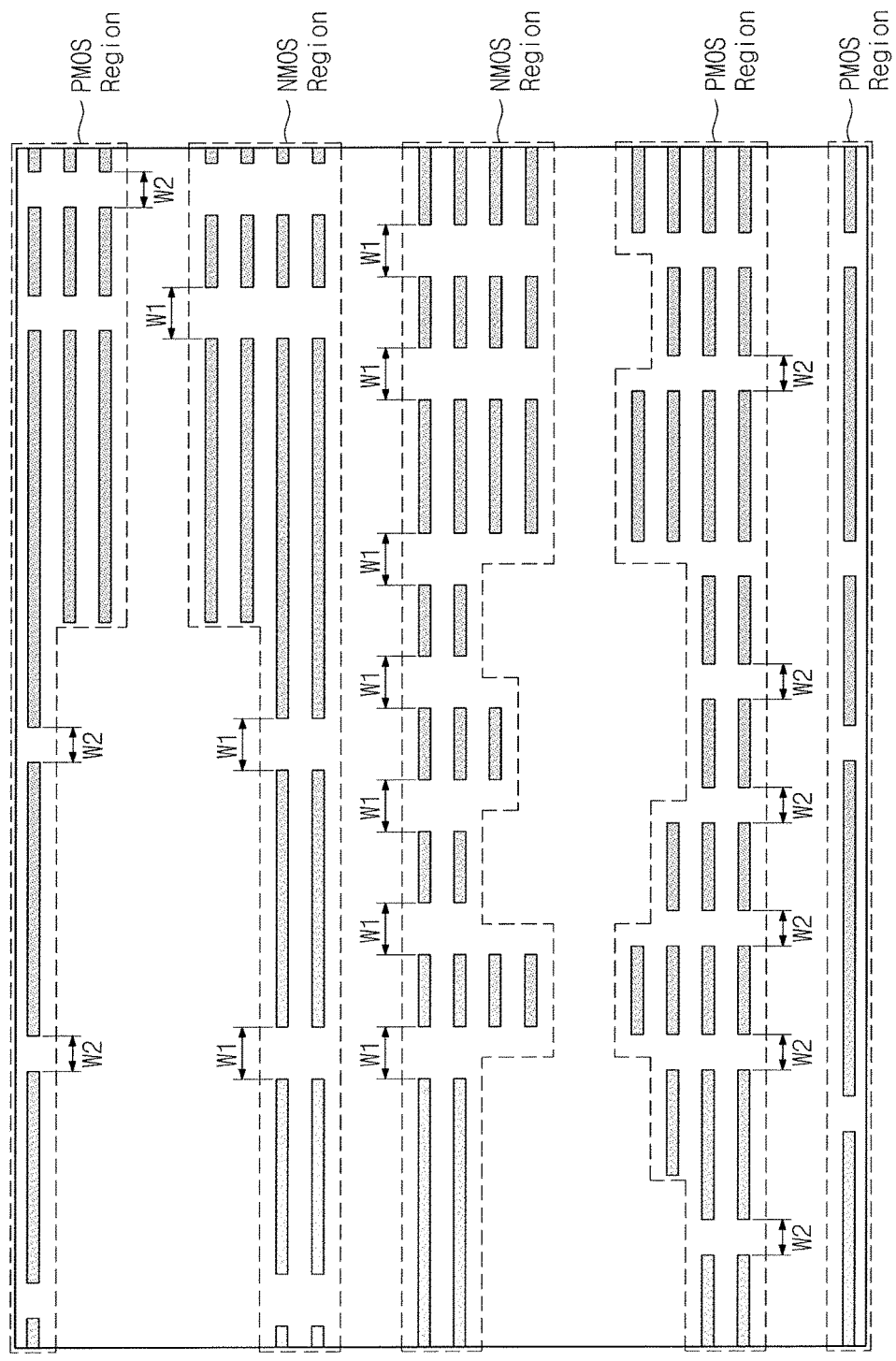
FIG. 10 illustrates a plan view of an arrangement of active fins of a fin-FET semiconductor device according to example embodiments.

FIGS. 8 and 9 are graphs exemplarily showing technical effects that can be achieved by example. In detail, FIG. 8 is a graph showing a relationship between current of a NMOS transistor and a width of the second separation region ISY, and FIG. 9 is a graph showing a relationship between current of a PMOS transistor and a width of the second separation region ISY. FIG. 10 is a plan view exemplarily illustrating an arrangement of the active fins AF of a fin-FET semiconductor device according to example embodiments.

Referring to FIGS. 8 and 9, as the width of the second separation region ISY increases, NMOS transistors had an increased current (FIG. 8) and PMOS transistors had a decreased current (FIG. 9). In other words, when the width of the second separation region ISY, i.e., a diffusion brake region, was changed, the NMOS transistors had reciprocal current characteristics with respect to the PMOS transistors. The difference in dependencies of NMOS and PMOS transistors on the width of the second separation region ISY or the diffusion brake region may be utilized to realize fin-FETs with improved performance and reduce a variation in electric characteristics of the fin-FETs. Furthermore, the difference in dependencies of NMOS and PMOS transistors on the width of the second separation region ISY or the diffusion brake region may be utilized to optimize electric characteristics of circuits constituting the semiconductor device. For example, as illustrated in FIG. 10, if a circuit is configured to include a NMOS transistor with an increased current property, a width of the second separation region ISY for the NMOS transistors may be greater than that for the PMOS transistors, i.e., W1 in the NMOS region may be larger than W2 in the PMOS region. In contrast, if a circuit is configured to include a PMOS transistor with an increased current amount, a width of the second separation region ISY for the NMOS transistors may be smaller than that for the PMOS transistors.

Figure 11:
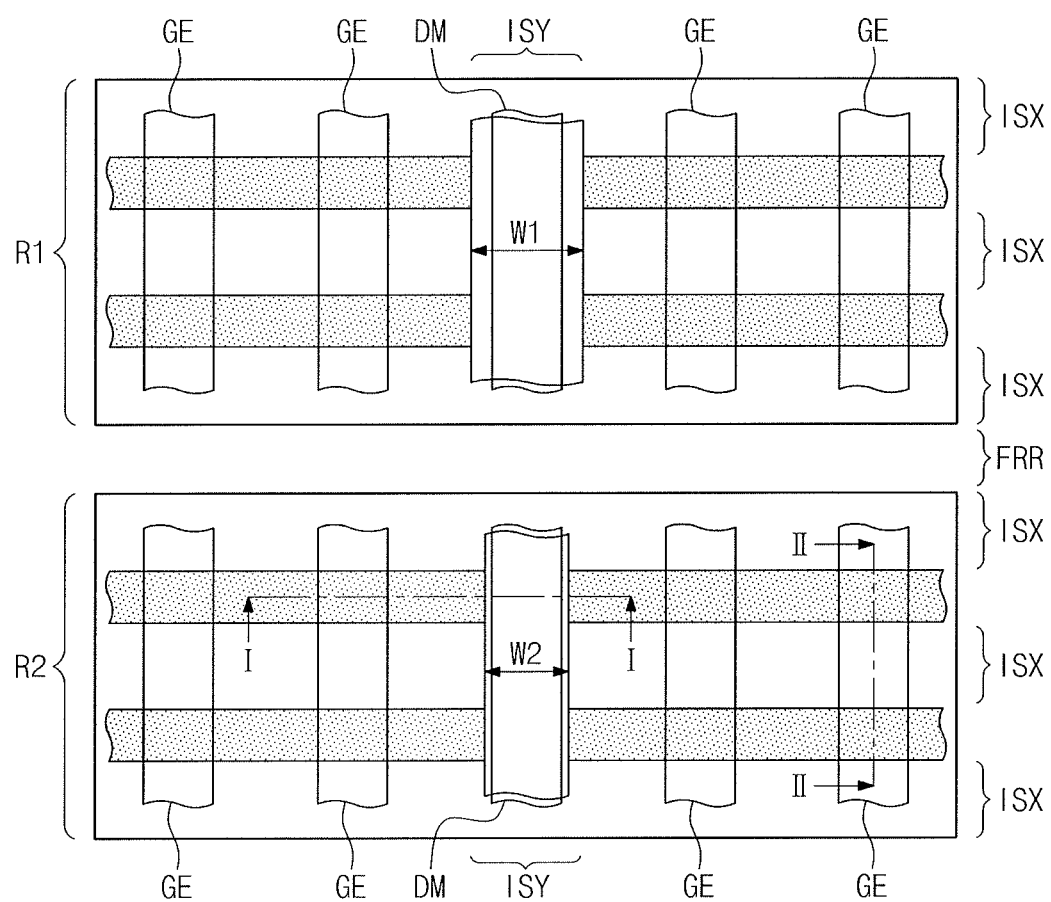
FIG. 11 illustrates a plan view of a method of fabricating a fin-FET semiconductor device including active fins according to example embodiments.

FIG. 11 is a plan view illustrating a method of fabricating a fin-FET semiconductor device including the active fins AF according to example embodiments. FIGS. 12 through 16 are sectional views taken along dotted lines I-I and II-II of FIG. 11 to illustrate stages in a method of fabricating the fin-FET semiconductor device with the active fins AF.

Figure 12:
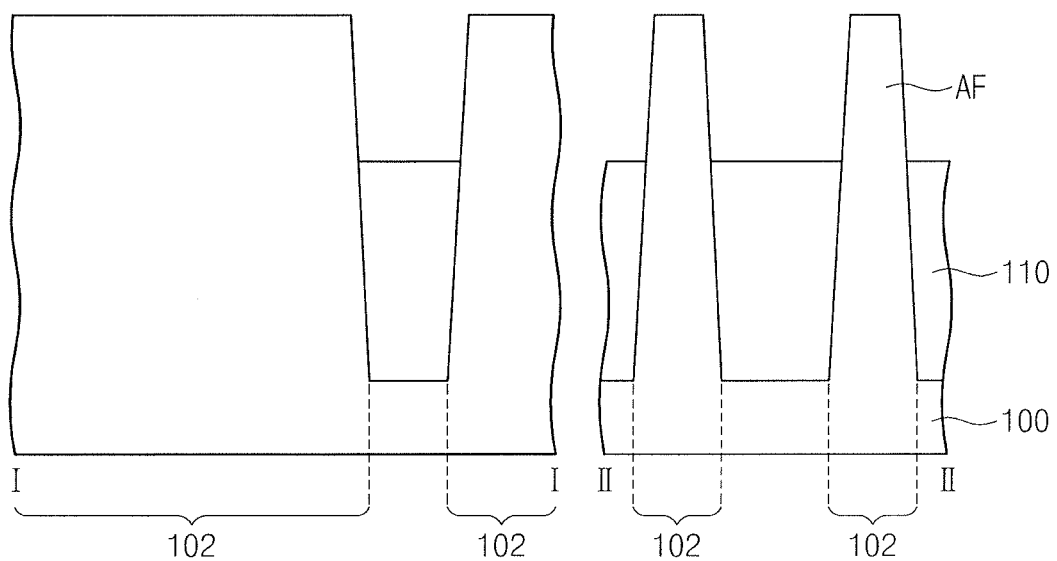
FIGS. 12 through 16 illustrate sectional views taken along lines I-I and II-II of FIG. 11 to illustrate stages in a method of fabricating a fin-FET semiconductor device, in which active fins according to example embodiments are provided.

Referring to FIGS. 11 and 12, a device isolation layer 110 may be formed in a substrate 100 to define active patterns 102. Thereafter, the device isolation layer 110 may be recessed to expose upper portions (hereinafter, active fins AF) of the active patterns 102. Accordingly, the device isolation layer 110 may be formed to have a top surface lower than those of the active fins AF and expose sidewalls of the active fins AF. The active patterns 102 may be formed at respective regions of the substrate 100, other than the first separation regions ISX, the second separation regions ISY, and the fin-removing region FRR. Due to the fin-removing region FRR, the substrate 100 may be divided into the first and second regions R1 and R2, on which transistors of different conductivity types will be provided. In example embodiments, as shown in FIG. 11, the width of the second separation region ISY may be greater in the first region R1 than in the second region R2, but as described above, this difference may be reversed in consideration of electric characteristics required for each circuit.

The formation of the device isolation layer 110 may include forming trenches to define the active patterns 102 and filling the trenches with an insulating material. In example embodiments, the device isolation layer 110 may include at least one of a silicon oxide layer, a silicon nitride layer, a silicon oxynitride layer, or low-k dielectric layers, but example embodiments are not limited thereto.

Figure 13:
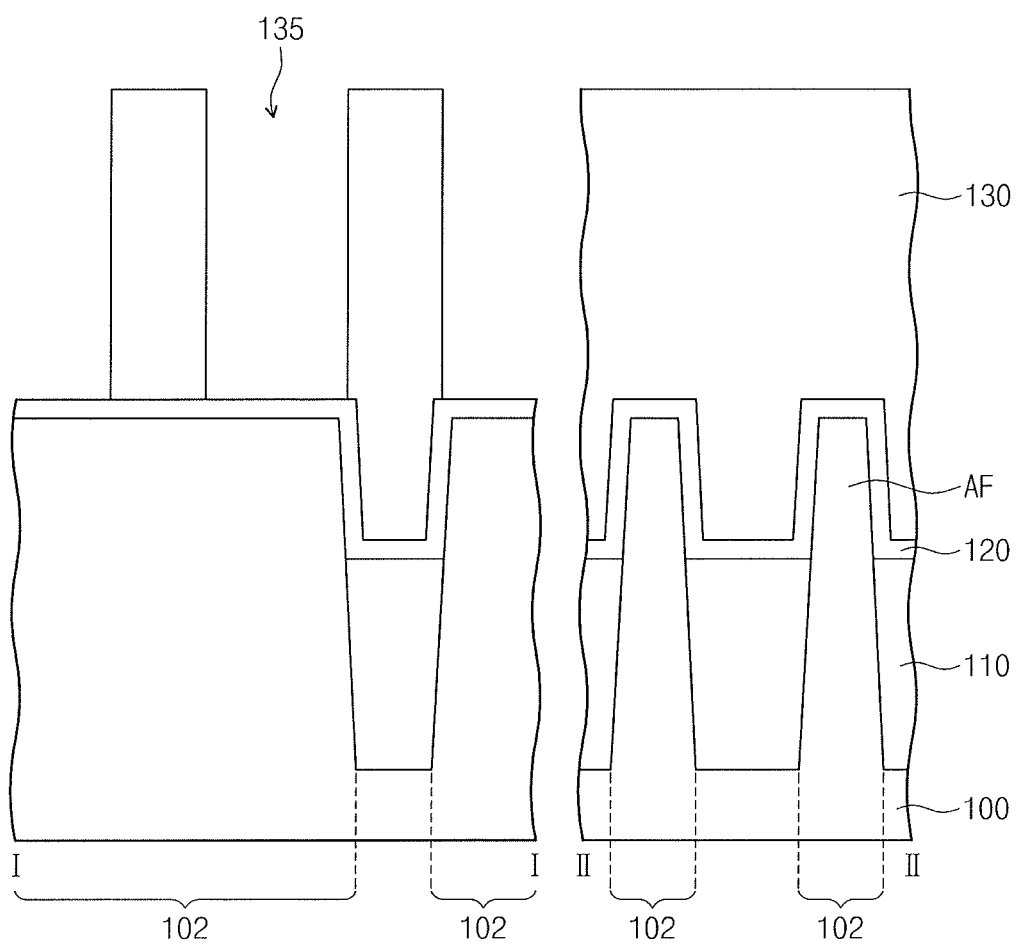

Referring to FIGS. 11 and 13, an etch stop layer 120 and a mask pattern 130 may be formed on the structure provided with the active fins AF. The etch stop layer 120 may include a plurality of insulating layers, at least one of which is of a material having an etch selectivity with respect to the others. For example, the etch stop layer 120 may include a first etch stop layer including a silicon oxide layer, a second etch stop layer including a silicon oxynitride layer or a silicon nitride layer, and a buffer layer including a poly-silicon layer, an amorphous silicon layer or an oxide layer, but example embodiments are not limited thereto.

The mask pattern 130 may be formed to have a longitudinal axis crossing the active fins AF. For example, the mask patterns 130 may be formed at positions for the gate electrodes GE and the dummy gates DM of FIG. 11. Openings 135 may be formed between the mask patterns 130 to cross the active fins AF and expose the etch stop layer 120.

Figure 14:
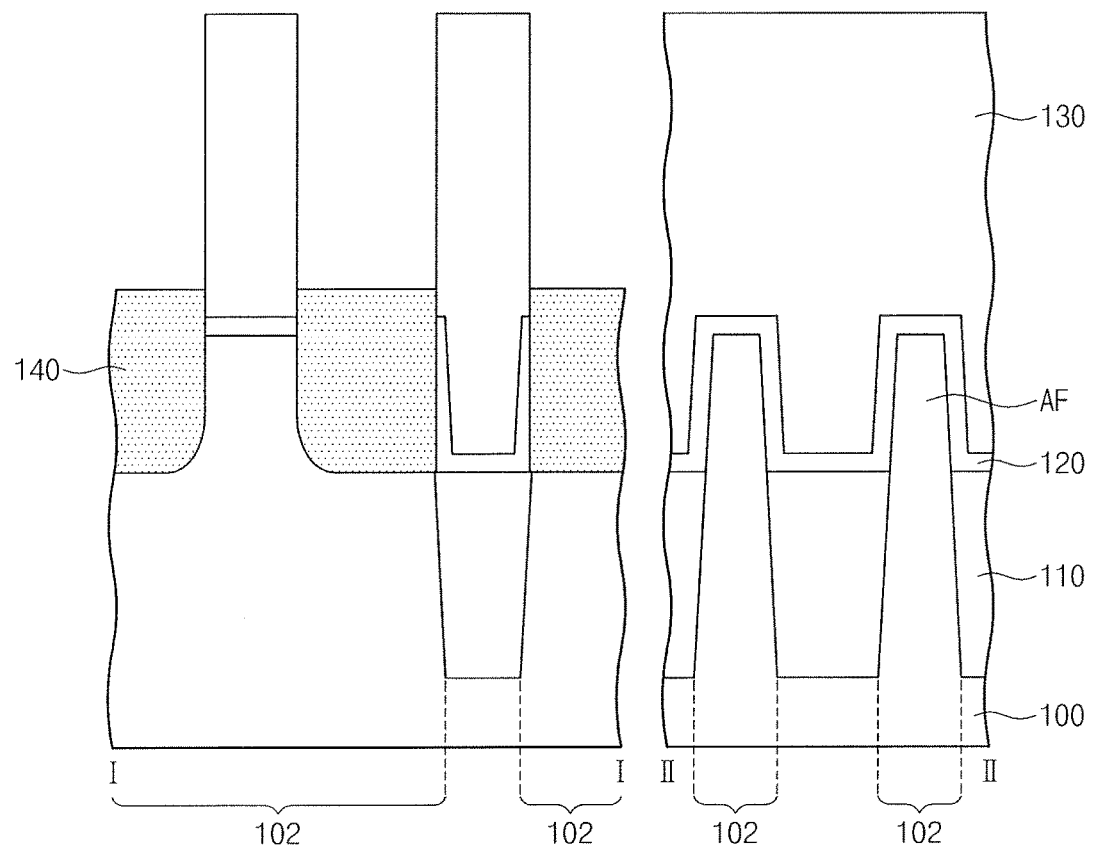

Referring to FIGS. 11 and 14, the etch stop layer 120 and the active fins AF under the openings 135 may be etched using the mask pattern 130 as etch mask. Thereafter, epitaxial patterns 140 may be formed on the etched portions of the active fins AF. In example embodiments, on the first region R1, the epitaxial patterns 140 may be formed of the same material as the substrate 100 or of at least one of materials capable of exerting tensile stress on the substrate 100 (e.g., portions of the active fins AF below the mask pattern 130; hereinafter, channel regions), whereas on the second region R2, the epitaxial patterns 140 may be formed of at least one of materials capable of exerting compressive stress on the substrate 100 or the channel regions. For example, in the case where the substrate 100 is formed of silicon, the epitaxial patterns 140 of the first region R1 may be silicon or silicon-carbide patterns grown by an epitaxial process, and the epitaxial patterns 140 of the second region R2 may be silicon-germanium patterns grown by an epitaxial process. The materials enumerated for the epitaxial patterns may be used for the case that the first and second regions R1 and R2 are NMOS and PMOS regions, respectively, but the materials for the epitaxial patterns may be changed, if the first and second regions R1 and R2 are PMOS and NMOS regions, respectively.

Furthermore, in example embodiments, additional steps (e.g., of doping the epitaxial patterns 140 with impurities and/or of forming silicide patterns to cover the epitaxial patterns 140) may be further performed, after the formation of the epitaxial patterns 140. The silicide patterns may be formed to contain metallic elements, e.g., nickel (Ni), cobalt (Co), platinum (Pt), or titanium (Ti).

Figure 15:
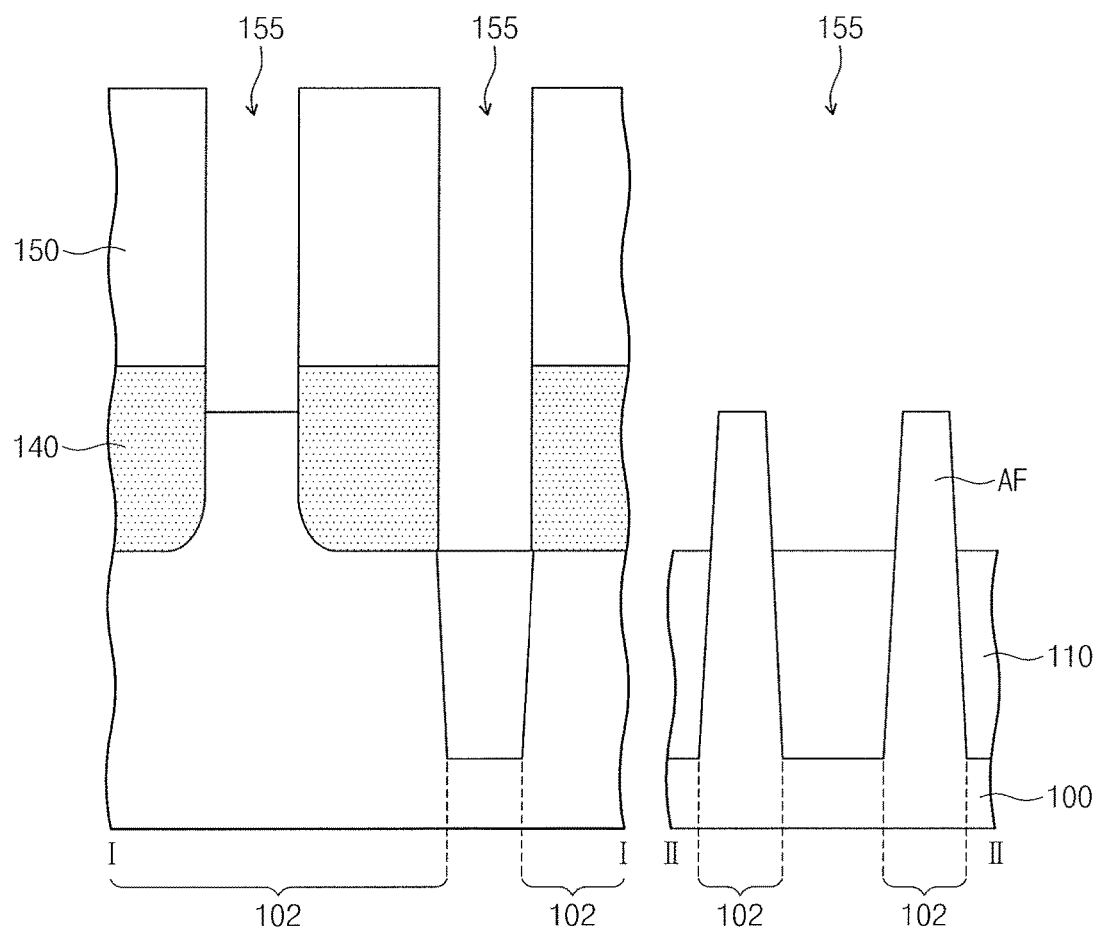

Referring to FIGS. 11 and 15, an interlayered insulating layer 150 may be formed on the structure provided with the epitaxial patterns 140. Then, the mask pattern 130 and the etch stop layer 120 may be removed to form gate regions 155 exposing the active fins AF.

The interlayered insulating layer 150 may include at least one of, e.g., a silicon oxide layer, a silicon nitride layer, a silicon oxynitride layer, or low-k dielectric layers, but example embodiments are not limited thereto. The formation of the gate regions 155 may include performing a planarization etching process on the interlayered insulating layer 150 to expose the mask pattern 130, removing the exposed mask pattern 130 to expose the etch stop layer 120, and removing the etch stop layer 120 to expose the active fins AF.

Figure 16:
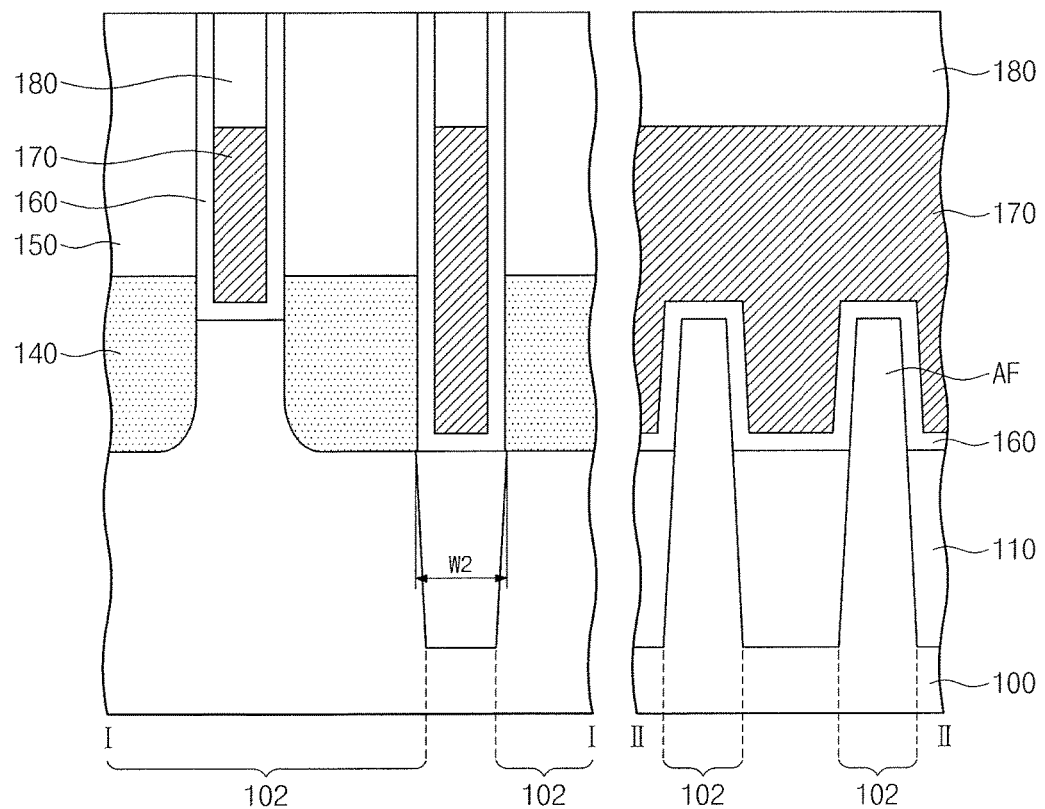

Referring to FIGS. 11 and 16, gate structures may be formed in the gate regions 155. Each of the gate structures may include a gate insulating layer 160, a gate conductive pattern 170, and a capping pattern 180. The formation of the gate structures may include forming the gate insulating layer 160 to conformally cover the gate regions 155, sequentially forming a gate conductive layer and a capping layer to fill the gate regions 155, on which the gate insulating layer 160 is formed, and then, performing a planarization etching process on the capping layer and the gate conductive layer to expose the interlayered insulating layer 150 or the gate insulating layer 160.

The gate insulating layer 160 may include a high-k dielectric material having a dielectric constant higher than that of a silicon oxide layer. For example, the gate insulating layer 160 may include at least one of $HfO_2$, $ZrO_2$, or $Ta_2O_5$, but example embodiments are not limited thereto. The gate conductive layer may be formed of or include at least one of metals or silicon. In example embodiments, the gate conductive layer may be formed to include a plurality of metal layers. For example, the gate conductive layer may include a first metal layer for controlling work function and a second metal layer, whose resistivity is lower than that of the first metal layer. The first metal layer may be formed of or include at least one of, e.g., TiN, TaN, TiC, or TaC. The capping layer may be formed of an insulating or conductive material.

Figure 17:
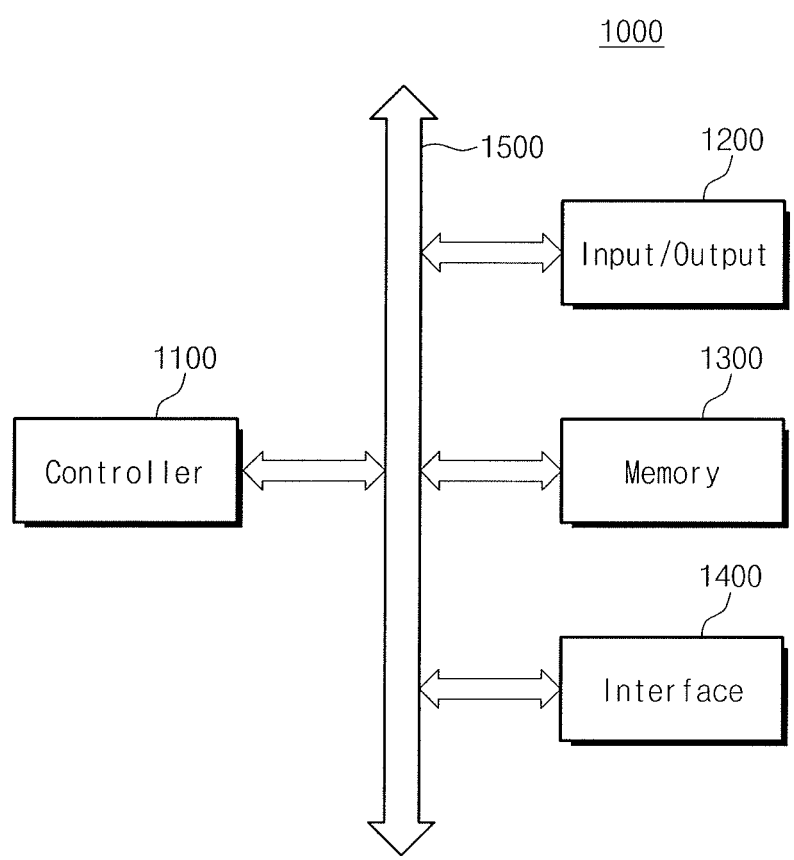
FIG. 17 illustrates a schematic block diagram of an electronic system including a semiconductor device according to example embodiments.

FIG. 17 is a schematic block diagram illustrating an electronic system including the semiconductor device according to example embodiments. The electronic system of FIG. 17 may be an example of electronic systems including at least one of the semiconductor devices described with reference to FIGS. 1 through 16.

Referring to FIG. 17, an electronic system 1000 according to example embodiments may include a controller 1100, an input/output (I/O) unit 1200, a memory device 1300, an interface unit 1400, and a data bus 1500. At least two of the controller 1100, the I/O unit 1200, the memory device 1300, and the interface unit 1400 may communicate with each other through the data bus 1500. The data bus 1500 may correspond to a path through which electrical signals are transmitted.

The controller 1100 may include at least one of, e.g., a microprocessor, a digital signal processor, a microcontroller or other logic devices. For example, the other logic devices may be formed to have a similar function to any one of the microprocessor, the digital signal processor and the microcontroller. The I/O unit 1200 may include, e.g., a keypad, a keyboard, or a display unit. The memory device 1300 may store data and/or commands. The interface unit 1400 may transmit electrical data to a communication network or may receive electrical data from a communication network. The interface unit 1400 may operate by wireless communication or cable communication. For example, the interface unit 1400 may include an antenna for wireless communication or a transceiver for cable communication. Although not shown in the drawings, the electronic system 1000 may further include a fast dynamic random-access memory (DRAM) device and/or a fast static random-access memory (SRAM) device that acts as a cache memory for improving an operation of the controller 1100. The field effect transistor according to example embodiments may be provided in the memory device 1300 or serve as components of the controller 1100 and/or the I/O unit 1200.

The electronic system 1000 may be applied to, e.g., a personal digital assistant (PDA), a portable computer, a web tablet, a wireless phone, a mobile phone, a digital music player, a memory card, or an electronic product. For example, the electronic product may receive or transmit information data by wireless communication.

According to example embodiments, a semiconductor device may have NMOS and PMOS regions, in which diffusion brake regions are formed to have different widths from each other. Therefore, as there is a difference in dependency on a width of the diffusion brake region between current characteristics of the NMOS and PMOS transistors, such a difference can be utilized to improve performance characteristics of the NMOS or PMOS fin-FET and reduce a variation in electric characteristics thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate with a NMOS region and a PMOS region;
a device isolation layer on the substrate to define active fins;
gate patterns on the active fins having a length direction crossing the active fins; and
dummy gate patterns extending in the length direction of the gate patterns,
wherein the device isolation layer includes a first diffusion brake region on the NMOS region and a second diffusion break region on the PMOS region,
wherein the first and second diffusion brake regions extend in the length direction of the gate patterns,
wherein a pitch between the active fins within the NMOS region is substantially the same as a pitch between the active fins within the PMOS region,
wherein a width of the first diffusion brake region is different from a width of the second diffusion brake region,
wherein the dummy gate patterns overlap the first diffusion brake region and the second diffusion brake region,
wherein at least one of the dummy gate patterns extends between facing terminal edges of a first pair of the active fins within the NMOS region, the first pair of the active fins within the NMOS region being spaced apart from each other along a length direction of the active fins, and the at least one of the dummy gate patterns being between the facing terminal edges of the first pair of the active fins within the NMOS region,
wherein at least another of the dummy gate patterns extends between facing terminal edges of a first pair of the active fins within the PMOS region, the first pair of the active fins within the PMOS region being spaced apart from each other along the length direction of the active fins, and the at least another of the dummy gate patterns being between the facing terminal edges of the first pair of the active fins within the PMOS region, and
wherein each of the dummy gate patterns includes a conductive pattern and a gate insulating layer covering sidewalls and a bottom surface of the conductive pattern.

2. The device as claimed in claim 1, wherein:
the first diffusion brake region continuously extends between the facing terminal edges of the first pair of the active fins within the NMOS region and facing terminal edges of a second pair of the active fins within the NMOS region, and
the second diffusion brake region continuously extends between the facing terminal edges of the first pair of the active fins within the PMOS region and facing terminal edges of a second pair of the active fins within the PMOS region.

3. The device as claimed in claim 1, wherein the width of the first diffusion brake region along a longitudinal direction of the active fins is greater than the width of the second diffusion brake region along the longitudinal direction of the active fins.

4. The device as claimed in claim 1, wherein the width of the first diffusion brake region along a longitudinal direction of the active fins is smaller than the width of the second diffusion brake region along the longitudinal direction of the active fins.

5. The device as claimed in claim 1, wherein:
the device isolation layer has a top surface lower than top surfaces of the active fins, the device isolation layer exposing sidewalls of each of the active fins, and
each of the gate patterns crosses at least one of the active fins and faces sidewalls of the active fins, the sidewalls of the active fins being parallel to a longitudinal direction of the active fins.

6. The device as claimed in claim 1, wherein a distance between centers of each dummy gate pattern and one of the first and second diffusion brake regions most adjacent thereto is less than a distance between centers of each dummy pattern and one of the gate patterns most adjacent thereto.

7. The device as claimed in claim 1, further comprising epitaxial patterns at opposite sides of each of the gate patterns,
wherein each of the active fins further includes a channel region below the gate pattern, and the epitaxial patterns include a material to exert compressive or tensile stress on the channel region.

8. The device as claimed in claim 1, wherein the at least one of the dummy gate patterns and the at least another of the dummy gate patterns constitute a single dummy gate pattern having a line shape.

9. A semiconductor device, comprising:
a substrate with a NMOS region and a PMOS region;
active fins on the NMOS and PMOS regions of the substrate;
gate patterns crossing the active fins; and
dummy gate patterns extending parallel to the gate patterns,
wherein first separation regions define long sidewalls of the active fins,
wherein second separation regions define short sidewalls of the active fins, and
wherein widths of the second separation regions in the NMOS region are different than those in the PMOS region,
wherein the dummy gate patterns overlap the second separation regions in the NMOS and PMOS regions,
wherein at least one of the dummy gate patterns is between facing short sidewalls of a pair of the active fins within the NMOS region, the facing short sidewalls of the pair of the active fins within the NMOS region being spaced apart from each other along a length direction of the active fins,
wherein at least another of the dummy gate patterns is between facing short sidewalls of a pair of the active fins within the PMOS region, the facing short sidewalls of the pair of the active fins within the PMOS region being spaced apart from each other along the length direction of the active fins, and
wherein each of the dummy gate patterns includes a conductive pattern and a gate insulating layer covering sidewalls and a bottom surface of the conductive pattern.

10. The device as claimed in claim 9, wherein the first separation regions are spaced apart from each other by substantially a same distance, and the active fins have substantially a same width.

11. The device as claimed in claim 9, wherein the width of the second separation region is greater in the NMOS region than in the PMOS region.

12. The device as claimed in claim 9, wherein the width of the second separation region is smaller in the NMOS region than in the PMOS region.

13. The device as claimed in claim 9, wherein widths of the second separation regions are the same in the NMOS region, and
wherein widths of the second separation regions are the same in the PMOS region.

14. The device as claimed in claim 9, wherein a pitch between the active fins within the NMOS region is substantially the same with a pitch between the active fins within the PMOS region.

15. The device as claimed in claim 9, wherein the at least one of the dummy gate patterns and the at least another of the dummy gate patterns constitute a single dummy gate pattern having a line shape.

16. A semiconductor device, comprising:
a substrate with a NMOS region and a PMOS region;
a device isolation layer on the substrate to define active fins;
gate patterns crossing the active fins; and
epitaxial patterns at opposite sides of each of the gate patterns,
wherein the device isolation layer includes first and second separation regions, each of the first and second separation regions having portions directly between facing epitaxial patterns,
wherein the first separation region is between respective pairs of the active fins within the NMOS region,
wherein the second separation region is between respective pairs of the active fins within the PMOS region,
wherein a width of the first separation region along a length direction of the active fins is different from a width of the second separation region along the length direction of the active fins, and
wherein top surfaces of the first and second separation regions are lower than top surfaces of the epitaxial patterns.

17. The device as claimed in claim 16, wherein the width of the first separation region along the length direction of the active fins is larger than the width of the second separation region along the length direction of the active fins.

18. The device as claimed in claim 16, wherein the width of the first separation region along the length direction of the active fins is smaller than the width of the second separation region along the length direction of the active fins.

19. The device as claimed in claim 16, wherein the first separation region is provided with a plurality of first separation regions within the NMOS region and the second separation region is provided with a plurality of second separation regions within the PMOS region, and
wherein widths of all the first separation regions are equal to each other, and widths of all the second separation regions are equal to each other.

20. The device as claimed in claim 16, wherein a pitch between the active fins within the NMOS region is substantially the same with a pitch between the active fins within the PMOS region.

* * * * *